United States Patent
Xing et al.

(10) Patent No.: US 10,446,105 B2
(45) Date of Patent: Oct. 15, 2019

(54) THIN FILM TRANSISTOR LIQUID CRYSTAL DISPLAY PANEL

(71) Applicant: Wuhan China Star Optoelectronics Technology Co., Ltd., Wuhan, Hubei (CN)

(72) Inventors: Zhenzhou Xing, Guangdong (CN); Qingcheng Zuo, Guangdong (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 44 days.

(21) Appl. No.: 15/744,787

(22) PCT Filed: Nov. 30, 2017

(86) PCT No.: PCT/CN2017/114075
§ 371 (c)(1),
(2) Date: Jan. 13, 2018

(87) PCT Pub. No.: WO2019/085130
PCT Pub. Date: May 9, 2019

(65) Prior Publication Data
US 2019/0130861 A1 May 2, 2019

(30) Foreign Application Priority Data
Oct. 30, 2017 (CN) .......................... 2017 1 1062628

(51) Int. Cl.
*G09G 3/36* (2006.01)
*G02F 1/1362* (2006.01)
(Continued)

(52) U.S. Cl.
CPC ......... *G09G 3/3688* (2013.01); *G02F 1/1368* (2013.01); *G02F 1/134309* (2013.01);
(Continued)

(58) Field of Classification Search
None
See application file for complete search history.

(56) References Cited

U.S. PATENT DOCUMENTS

2015/0206471 A1* 7/2015 Su ....................... G09G 3/3607
345/694
2017/0205673 A1* 7/2017 Wang ................. G02F 1/13306

* cited by examiner

*Primary Examiner* — Kenneth B Lee, Jr.
(74) *Attorney, Agent, or Firm* — Hemisphere Law, PLLC; Zhigang Ma

(57) ABSTRACT

Embodiments provide a thin film transistor liquid crystal display panel comprising: data lines for transmitting data signals; scan lines being crossly arranged with the data lines to define pixel regions, pixel electrodes being disposed in the pixel regions, and a first and a second feed through voltage being voltage drops generated on the pixel electrodes, respectively; common electrodes comprising a first common electrode and a second common electrode, a first common voltage being a voltage on the first common electrode, a second common voltage being a voltage on the second common electrode, the first common electrode being arranged above the pixel electrode on which the first feed through voltage is generated for compensating the voltage reduction caused by the first feed through voltage, and the second common electrode being arranged above the pixel electrode on which the second feed through voltage is generated for compensating the voltage reduction caused by the second feed through voltage.

9 Claims, 3 Drawing Sheets

(51) Int. Cl.
*G02F 1/1368* (2006.01)
*G02F 1/1343* (2006.01)
*H01L 27/12* (2006.01)

(52) U.S. Cl.
CPC ..... *G02F 1/136286* (2013.01); *G09G 3/3607* (2013.01); *G09G 3/3655* (2013.01); *G09G 3/3677* (2013.01); *H01L 27/124* (2013.01); *G02F 2201/121* (2013.01); *G02F 2201/123* (2013.01); *G09G 2300/0426* (2013.01); *G09G 2310/0297* (2013.01); *G09G 2320/0219* (2013.01)

THIN FILM TRANSISTOR LIQUID CRYSTAL DISPLAY PANEL

RELATED APPLICATIONS

The present application is a National Phase of International Application Number PCT/CN2017/114075 filed on Nov. 30, 2017, and claims the priority of China Application No. 201711062628.4, filed on Oct. 30, 2017.

FIELD OF THE DISCLOSURE

The disclosure relates to a display technical field, and more particularly to a thin film transistor liquid crystal display panel.

BACKGROUND

Along with rapid development of thin film transistor liquid crystal display technologies, requirement of clarity, i.e., resolution, of the thin film transistor liquid crystal display panel is increased, too. Increasing of resolution requires increased number of data lines connected to the source driver. To decrease the number of data lines connected to the source driver, a method for charging pixel electrodes separately through time-sharing switching is generally used.

The time-sharing driving method mentioned above requires very high switching frequencies and results in large power consumption of the thin film transistor liquid crystal display panel. To solve the problem, the existed technology provides a way to decrease power consumption by decreasing switching frequencies of some switches, however, two different feed through voltage drops are generated on the pixel electrodes accordingly. This is one of the ways to generate two different feed through voltage drops on the pixel electrodes in the existed technologies, and, at the same time, there are still other ways to generate two different feed through voltage drops on the pixel electrodes. However, in general, the common electrode is a single entity and provides only one common voltage. Therefore, the two different voltage drops generated on the pixel electrodes due to the two different feed through voltage drops cannot be compensated by the common voltage provided by the common electrode, and displaying effects of the thin film transistor liquid crystal display panel are bad. It is a subject worthy to be researched that how to resolve the problem and get the best displaying effects.

SUMMARY

The technique issues to be solved by the embodiments of the present invention is to provide a thin film transistor liquid crystal display panel to solve the problem of bad displaying effects of thin film transistor liquid crystal display panel.

In order to solve the technique issue mentioned above, one embodiment of the present invention provides a thin film transistor liquid crystal display panel, comprising:

a plurality of data lines extended along a vertical direction to transmit data signals;

a plurality of scan lines extended along a horizontal direction, the scan lines and the data lines being crossly arranged to define a plurality of pixel regions, a plurality of pixel electrodes being disposed in the pixel regions, and a first feed through voltage and a second feed through voltage being voltage drops generated on the pixel electrodes, respectively; and a plurality of common electrodes comprising a first common electrode and a second common electrode, a first common voltage being a voltage on the first common electrode, a second common voltage being a voltage on the second common electrode, the first common electrode being arranged above the pixel electrode on which the first feed through voltage is generated for compensating the voltage reduction caused by the first feed through voltage, and the second common electrode being arranged above the pixel electrode on which the second feed through voltage is generated for compensating the voltage reduction caused by the second feed through voltage.

Wherein, the pixel electrodes comprise a first pixel electrode and a second pixel electrode, the first feed through voltage is generated on the first pixel electrode, the second feed through voltage is generated on the second pixel electrode, a plurality of the first pixel electrodes are arranged in a plurality of first columns, a plurality of the second pixel electrodes are arranged in a plurality of second columns, the first common electrode comprises a plurality of first branch electrodes arranged along the vertical direction, the first branch electrodes are arranged corresponding to the first pixel electrodes arranged in the first columns, the second common electrode comprises a plurality of second branch electrodes arranged along the vertical direction, and the second branch electrodes are arranged corresponding to the second pixel electrodes arranged in the second columns.

Wherein, the pixel electrodes comprise a first pixel electrode and a second pixel electrode, the first feed through voltage is generated on the first pixel electrode, the second feed through voltage is generated on the second pixel electrode, a plurality of the first pixel electrodes are arranged in a Z shape along the vertical direction, a plurality of the second pixel electrodes are arranged in a S shape along the vertical direction, the first common electrode comprises a first branch electrode, the first branch electrode is arranged corresponding to the first pixel electrodes and in the Z shape, the second common electrode comprises a second branch electrode, and the second branch electrode is arranged corresponding to the second pixel electrodes and in the S shape.

Wherein, the thin film transistor liquid crystal display panel further comprises:

a plurality of original data lines for inputting the data signals;

a plurality of selector sets, each of the selector sets comprising a plurality of multiplexers, sources of the multiplexers in a same selector set being electrically connected to a same original data line, and gates of the multiplexers in the same selector set receiving different control signals; wherein, the data lines are divided into a plurality of sub-line sets, the sub-line sets are arranged corresponding to the selector sets one by one, each sub-line set comprises at least two of the data lines, the data lines in a same sub-line set are electrically connected to drains of the multiplexers in the same selector set, respectively; a side of each data line away from the drain of the multiplexer is electrically connected to at least two of the pixel electrodes; the multiplexers in each selector set are turned on in a looped sequence started from a predetermined first multiplexer to a predetermined last multiplexer and then from the predetermined last multiplexer to the predetermined first multiplexer to input the data signals to corresponded pixel electrodes.

Wherein, a number of the multiplexers in each selector set is M, a number of the data lines in each sub-line set is N, M is equals to N, and M is an integer greater than 2.

Wherein, N and M are both 3.

Wherein, frequencies of the control signals received by the predetermined first multiplexer and the predetermined last multiplexer of each selector set are less than frequencies of the control signals received by the multiplexers between the predetermined first multiplexer and the predetermined last multiplexer.

Wherein, the frequencies of the control signals received by the predetermined first multiplexer and the predetermined last multiplexer of each selector set are half of the frequencies of the control signals received by the multiplexers between the predetermined first multiplexer and the predetermined last multiplexer.

Wherein, the predetermined first multiplexer is the first one of the multiplexers of each selector set, and the predetermined last multiplexer is the last one of the multiplexers of each selector set.

Wherein, the first common electrode is electrically connected as a whole, and the second common electrode is electrically connected as a whole.

Benefits of performing embodiments of the present invention are as follows:

The common electrode comprises a first common electrode and a second common electrode, the first common voltage is the voltage on the first common electrode, the second common voltage is the voltage on the second common electrode, the first common electrode is arranged above the pixel electrode on which the first feed through voltage is generated, and the second common electrode is arranged above the pixel electrode on which the second feed through voltage is generated, therefore the first common voltage could compensate the voltage drop due to the first feed through voltage on the pixel electrode, the second common voltage could compensate the voltage drop due to the second feed through voltage on the pixel electrode, and the displaying effects of the thin film transistor liquid crystal display panel are better.

BRIEF DESCRIPTION OF THE DRAWINGS

In order to make the descriptions of the technique solutions of the embodiments of the present invention or the existed techniques be clearer, the drawings necessary for describing the embodiments or the existed techniques are briefly introduced below. Obviously, the drawings described below are only some embodiments of the present invention, and, for those with ordinary skill in this field, other drawings can be obtained from the drawings described below without creative efforts.

DETAILED DESCRIPTION OF PREFERRED EMBODIMENTS

The technique solutions of the embodiments of the present invention will be clearly and fully described below accompanying with the drawings of the embodiments of the present invention. Obviously, the embodiments described below are only a part but not all of the embodiments of the present invention. Other embodiments obtained by those with ordinary skill in this art without creative efforts should belong to the protection scope of the present invention.

The terms "comprise", "have" and variations thereof used in the descriptions, claims and drawings of the present invention are intended to cover non-exclusive inclusions. For example, a process, method, system product or device comprising a series of steps or units is not limited to the listed steps or units but selectively comprises steps or units not listed or selectively comprises other steps or units always in the process, method, product or device. In addition, the terms "first", "second", "third", etc. are used to distinguish different objects but not for describing specific sequence.

First Embodiment

Figure 1:
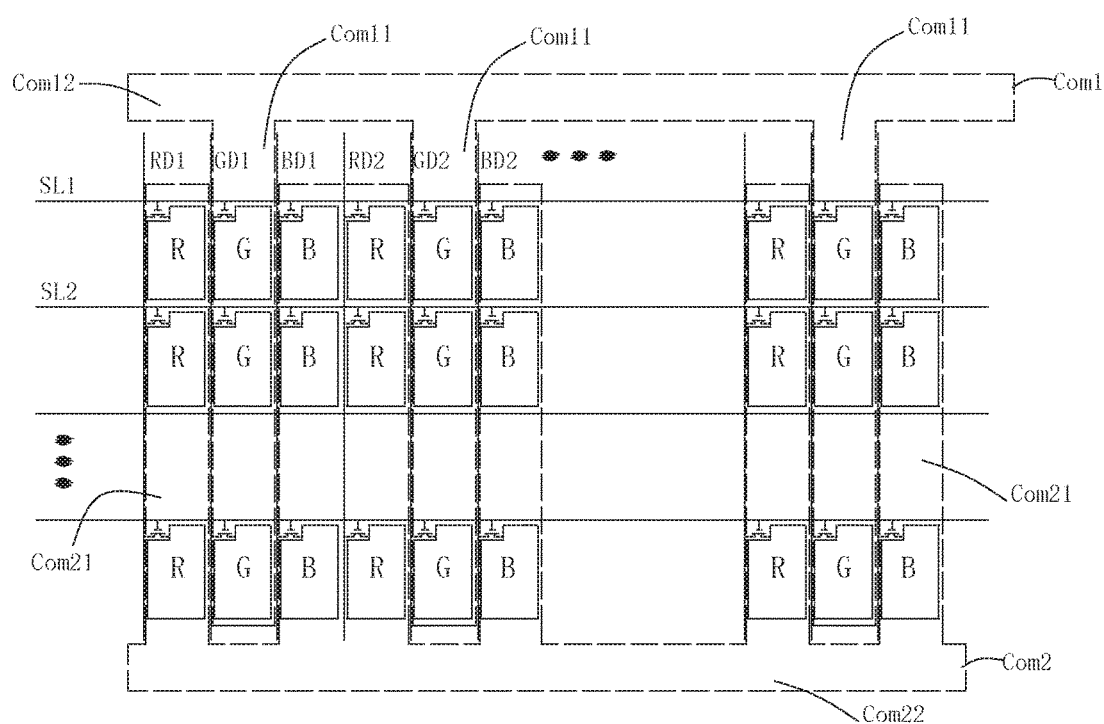
FIG. 1 is a schematic diagram of the thin film transistor liquid crystal display panel according to a first embodiment of the present invention.

The present embodiment of the invention provides a thin film transistor liquid crystal display panel, please refer to FIG. 1, comprising a plurality of data lines RD1, GD1, BD1, . . . , a plurality of scan lines SL1, SL2, . . . , and common electrode.

In the present invention, the data lines RD1, GD1, BD1, RD2, GD2, BD2, . . . are extended along a vertical direction, the upper terminals of the data lines RD1, GD1, BD1, RD2, GD2, BD2, . . . are electrically connected to source drivers (not shown in FIG. 1), and the source drivers output a plurality of data signals to the data lines RD1, GD1, BD1, RD2, GD2, BD2, . . . , respectively.

In the present embodiment, the scan lines SL1, SL2, . . . are extended along a horizontal direction, the scan lines SL1, SL2, . . . are electrically connected to gate drivers (not shown in FIG. 1), and the gate drivers output scan signals to the data line SL1, SL2, . . . . The gate drivers and source drivers cooperate to output data signals to the pixel electrodes described below.

In the present embodiment, the data lines RD1, GD1, BD1, RD2, GD2, BD2, . . . are crossly arranged with the scan lines SL1, SL2, . . . , and a plurality of pixel regions are defined by the crossly arranged data lines RD1, GD1, BD1, RD2, GD2, BD2, . . . and scan lines SL1, SL2, . . . . A plurality of pixel electrodes are formed in the pixel regions. The pixel electrodes in the present embodiment comprise red sub-pixel electrode R, green sub-pixel electrode G and blue sub-pixel electrode B. The data lines RD1, GD1, BD1, RD2, GD2, BD2, . . . are electrically connected to the pixel electrodes through thin film transistors. In the present embodiment, the pixel electrodes are arranged in a plurality of rows and columns. Each data line RD1, GD1, BD1, RD2, GD2, BD2, . . . is electrically connected to several pixel electrode rows. For example, the first data line RD1 is connected to several rows of red sub-pixel electrodes R, the second data line GD1 is connected to several rows of the green sub-pixel electrodes G, the third data line BD1 is connected to several rows of the blue sub-pixel electrodes B, and the data lines thereafter are also connected to several rows of pixel electrodes.

In the present embodiment, a voltage drop having a first feed through voltage and a voltage drop having a second feed through voltage is generated on several pixel electrodes, respectively. Specifically, voltage drops having the first feed through voltage and the second feed through voltage are generated on different pixel electrodes by switching the thin film transistors from turned-on to turned-off or other reasons.

In order to overcome the issue that different pixel electrodes are affected by two different feed through voltages, the common electrode comprises a first common electrode Com1 and a second common electrode Com2 in the present embodiment. The voltage on the first common electrode Com1 is the first common voltage, the voltage on the second common electrode Com2 is the second common voltage, and the first common voltage is different from the second common voltage. The first common electrode Com1 is arranged above the pixel electrodes on which the first feed through voltage is generated for compensating voltage drops generated on the pixel electrodes due to the first feed through voltage. Affection generated due to the voltage drop of the first feed through voltage on the pixel electrodes can be compensated through adjusting the first common voltage on the first common electrode Com1, so that the voltage of a pixel capacitor formed by the pixel electrode and the common electrode can be the same as or similar to a desired voltage and the displaying effects of the pixel capacitor are better. The second common electrode Com2 is arranged above the pixel electrodes on which the second feed through voltage is generated for compensating voltage drops generated on the pixel electrodes due to the second feed through voltage. Affection generated due to the voltage drop of the second feed through voltage on the pixel electrodes can be compensated through adjusting the second common voltage on the second common electrode Com2, so that the voltage of the pixel capacitor formed by the pixel electrode and the common electrode can be the same as or similar to the desired voltage and the displaying effects of the pixel capacitor are better. Therefore, the voltages of the pixel capacitors of which the second feed through voltage is generated on the pixel electrodes are compensated by the second common voltage on the second common electrode Com2 and the voltages of the pixel capacitors of which the first feed through voltage is generated on the pixel electrodes are compensated by the first common voltage on the first common electrode Com1 through adjusting voltages on the first common electrode Com1 and the second common electrode Com2 so that the voltages on the two kinds of pixel electrodes are the same as or similar to the voltage desired by the designers and a desired displaying effects of the thin film transistor liquid crystal display panel could be achieved.

Please refer to FIG. 1 again, in the present embodiment, the pixel electrodes comprise first pixel electrodes and second pixel electrodes. The first pixel electrodes are the green sub-pixels G, and the second pixel electrodes are the red sub-pixels R and the blue sub-pixels B. In the present embodiment, the green sub-pixels G are arranged in several columns, such as the second, fifth and eighth columns in FIG. 1, the red sub-pixels R are arranged in several columns, such as the first, fourth and seventh columns in FIG. 1, and the blue sub-pixels B are arranged in several columns, such as the third, sixth and ninth columns in FIG. 1.

Correspondingly, the first common electrode comprises a plurality of first branch electrodes Com11 extended along the vertical direction, and the first branch electrodes Com11 are arranged corresponding to the columns of the first pixel electrodes. For example, the first one of the first branch electrodes Com11 is arranged corresponding to the second pixel electrode column (the green sub-pixels G), the second one of the first branch electrodes Com11 is arranged corresponding to the fifth pixel electrode column (green sub-pixels G), the third one of the first branch electrodes Com11 is arranged corresponding to the eighth pixel electrode column (green sub-pixels G), . . . . In the present embodiment, the second common electrode comprises a plurality of second branch electrodes Com21 extended along the vertical direction, and the second branch electrodes Com21 are arranged corresponding to the columns of the second pixel electrodes. For example, the first one of the second branch electrodes Com21 is arranged corresponding to the first pixel electrode column (the red sub-pixels R), the second one of the second branch electrodes Com 21 is arranged corresponding to the third pixel electrode column (blue sub-pixels B), the third one of the second branch electrodes Com21 is arranged corresponding to the fourth pixel electrode column (red sub-pixels R), the fourth one of the second branch electrodes Com 21 is arranged corresponding to the sixth pixel electrode column (blue sub-pixels B), . . . .

In the present embodiment, the first common electrode is electrically connected as a whole and the second common electrode is electrically connected as a whole. Specifically, the first common electrode further comprises a first connecting electrode Com12, wherein the first connecting electrode Com12 is a long strip to connect all the first branch electrodes Com11. The second common electrode further comprises a second connecting electrode Com22, wherein the second connecting electrode Com22 is a long strip to connect all the second branch electrodes Com21.

Second Embodiment

Figure 2:
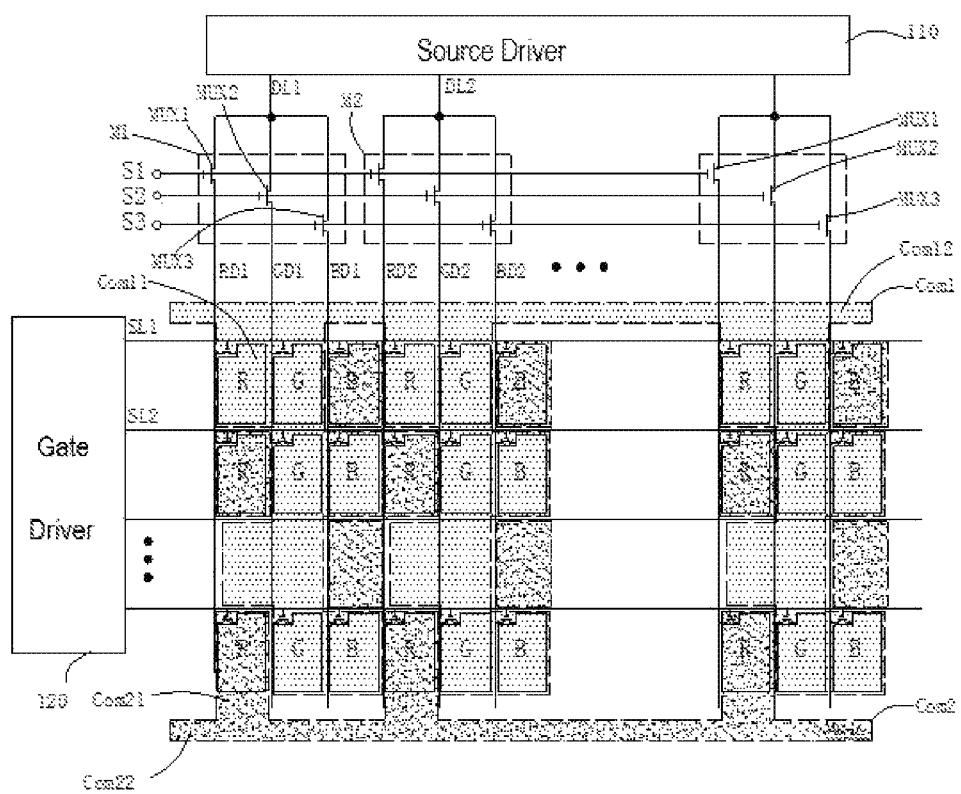
FIG. 2 is a schematic diagram of the thin film transistor liquid crystal display panel according to a second embodiment of the present invention.
Figure 3:
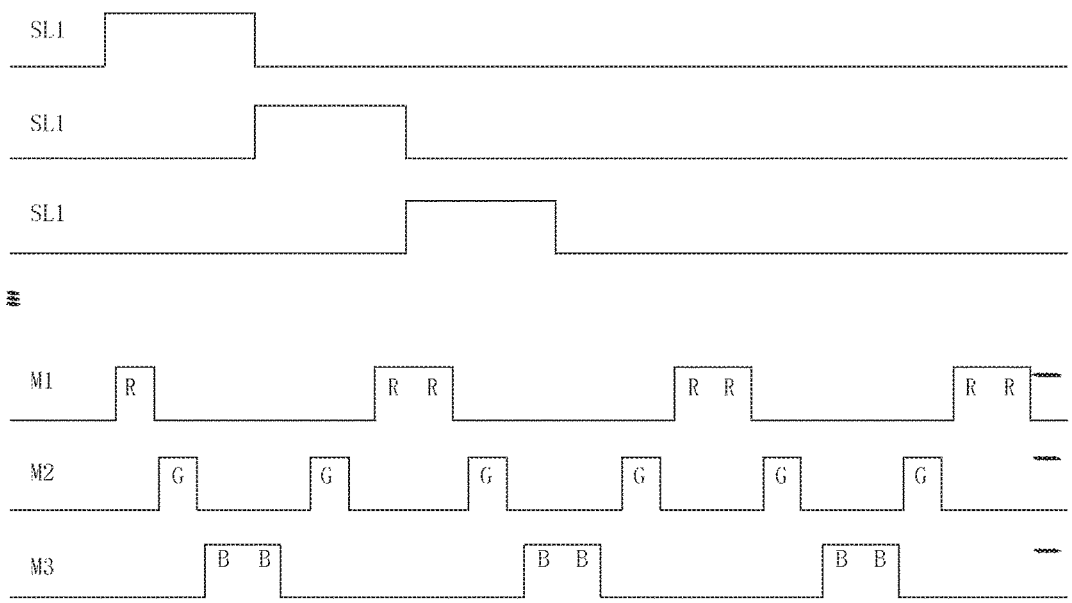
FIG. 3 is a timing chart showing the signals on the scan lines and control signals of the multiplexers in the same set according to the second embodiment of the present invention for power saving.

The second embodiment of the present invention further provides a thin film transistor liquid crystal display panel, please refer to FIG. 2 and FIG. 3, comprising a plurality of original data lines DL1, DL2, . . . , a plurality of scan lines SD1, SL2, . . . , a plurality of selector sets M1, M2, . . . , a plurality of sub-line sets and a common electrode.

In the present embodiment, the original data lines DL1, DL2, . . . are extended along the vertical direction, the upper terminals of the original data lines DL1, DL2, . . . are electrically connected to the source driver 110, and the source driver 110 outputs a plurality of data signals to the original data lines DL1, DL2, . . . simultaneously.

In the present embodiment, the scan lines SL1, SL2, . . . are extended along the horizontal direction, the scan lines SL1, SL2, . . . are electrically connected with the gate driver 120, and the gate driver 120 outputs scan signals to the scan lines SL1, SL2, . . . . The gate driver 120 and source driver 110 cooperate to output data signals to the pixel electrodes. In the present embodiment, the length of the original data lines DL1, DL2, . . . is shorter, and the original data lines DL1, DL2, . . . are not arranged to be cross with the scan lines SL1, SL2, . . . .

In the present embodiment, each selector set M1, M2, . . . comprises a plurality of multiplexers. In the present embodiment, one selector set comprising three multiplexers MUX1, MUX2 and MUX3 is taken as an example to simplify descriptions. The sources of all the multiplexers MUX1, MUX2 and MUX3 in the same selector set are electrically connected to the same original data lines DL1, DL2, . . . , and the gates of all the multiplexers MUX1, MUX2 and MUX3 in the same selector set receive different control signals S1, S2 and S3, respectively, In this embodiment, all the first multiplexers MUX1 receive the first control signal S1, all the second multiplexers MUX2 receive the second control signal S2, and all the third multiplexers MUX3 receive the third control signal S3. Please refer to FIG. 2 again, in the present embodiment, the sources of the multiplexers MUX1, MUX2 and MUX3 in the first selector set M1 are electrically connected to the first original data line DL1, the sources of the multiplexers MUX1, MUX2 and MUX3 in the second selector set M2 are electrically connected to the second original data line DL2, and the sources of the multiplexers MUX1, MUX2 and MUX3 in the third selector set M3 are electrically connected to the third original data line DL3. In the present embodiment, turning on or off of the multiplexers MUX1, MUX2 and MUX3 in different selector sets are controlled by the control signals S1, S2 and S3, respectively. When the control signals S1, S2 and S3 are high potentials, the corresponded multiplexers are turned on. When the control signals S1, S2 and S3 are low potentials, the corresponded multiplexers are turned off. Specifically, when the first control signal S1 is high potential, the second control signal S2 and the third control signal S3 are low potential at this time, the first multiplexers MUX1 in all the selector sets M1, M2, . . . are turned on and the second multiplexers MUX2 and the third multiplexers MUX3 are turned off. When the second control signal S2 is high potential, the first control signal S1 and the third control signal S3 are low potential at this time, the second multiplexers MUX2 in all the selector sets M1, M2, . . . are turned on and the first multiplexers MUX1 and the third multiplexers MUX3 are turned off. When the third control signal S3 is high potential, the second control signal S2 and the first control signal S1 are low potential at this time, the third multiplexers MUX3 in all the selector sets M1 M2, . . . are turned on and the second multiplexers MUX2 and the first multiplexers MUX1 are turned off.

In the present embodiment, the number of the multiplexers MUX1, MUX2 and MUX3 in each of the selector sets M1, M2, . . . are the same and equal to 3. The multiplexers MUX1, MUX2 and MUX3 in the same position of each selector set are turned on and off at the same time. For example, the first multiplexers MUX1 in each of the selector sets are turned on and off at the same time, the second multiplexers MUX2 in each of the selector sets are turned on and off at the same time, and the third multiplexers MUX3 in each of the selector sets are turned on and off at the same time. In addition, in other embodiments of the present invention, the number of multiplexers included in each selector set may not be equal.

In the present embodiment, the sub-line sets are arranged corresponding to the selector sets M1, M2, . . . one by one. Specifically, the first sub-line set is arranged corresponding to the first selector set M1, the second sub-line set is arranged corresponding to the second selector set M2, and the third sub-line set is arranged corresponding the third selector set M3. In the present embodiment, each sub-line set comprises several data lines, and the number of data lines in each sub-line set is 3 in the present embodiment. For example, the first sub-line set comprises the first red data line RD1, the first green data line GD1 and the first blue data line BD1, and the data lines in the same sub-line set are electrically connected to the drains of the multiplexers in the same selector set, respectively. In the present embodiment, the number of data lines in each sub-line set is N, the number of multiplexers in each one of the selector sets M1, M2, . . . is M, N equals to M and M is an integer greater than 2. In the present embodiment, M=N=3. Specifically, in the first sub-line set, the first data line RD1 is electrically connected to the drain of the first multiplexer MUX1 in the first selector set M1, the second data line GD1 is electrically connected to the drain of the second multiplexer MUX2 in the first selector set M1, and the third data line BD1 is electrically connected to the drain of the third multiplexer MUX3 in the first selector set M1. Similarly, the data lines RD2, GD2 and BD2 in the second sub-line set are electrically connected to the first multiplexer MUX1, the second multiplexer MUX2 and the third multiplexer MUX3 in the second selector set M2, and the data lines RD3, GD3 and BD3 in the third sub-line set are electrically connected to the first multiplexer MUX1, the second multiplexer MUX2 and the third multiplexer MUX3 in the third selector set M3.

In the present embodiment, the data lines RD1, GD1, BD1, RD2, GD2, BD2, . . . are all extended along the vertical direction, the data lines RD1, GD1, BD1, RD2, GD2, BD2, . . . are arranged to be cross with the scan lines SL1, SL2, . . . , the pixel regions are defined by the crossly arranged data lines RD1, GD1, BD1, RD2, GD2, BD2, . . . and scan lines SL1 SL2, . . . , and the pixel electrodes are formed in the pixel regions. In the present embodiment, the pixel electrodes comprise red sub-pixel electrodes R, green sub-pixel electrodes G and blue sub-pixel electrodes B. One side of the data lines RD1, GD1, BD1, RD2, GD2, BD2, . . . away from the drains of the multiplexers are electrically connected to the pixel electrodes through thin film transistors. In the present embodiment, the pixel electrodes are arranged in a plurality of rows and columns. Each data line RD1, GD1, BD1, RD2, GD2, BD2, . . . is electrically connected to several pixel electrode rows. For example, the first data line RD1 in the first sub-line set is connected to several rows of red sub-pixel electrodes R, the second data line GD1 in the first sub-line set is connected to several rows of the green sub-pixel electrodes G, the third data line BD1 in the first sub-line set is connected to several rows of the blue sub-pixel electrodes B, each data line in the second sub-line set also is connected to several rows of the pixel electrodes, and each data line in the third sub-line set also is connected to several rows of the pixel electrodes.

Please refer to FIG. 3. In order to save power, the multiplexers MUX1, MUX2, MUX3 in each selector set in the present invention are turned on in a looped sequence started from a predetermined first multiplexer to a predetermined last multiplexer and then from the predetermined last multiplexer to the predetermined first multiplexer. In the present embodiment, the predetermined first multiplexer is the first multiplexer MUX1, and the predetermined last multiplexer is the third multiplexer MUX3, When one of the scan lines SL1, SL2, . . . is enabled, the data signals output from the source driver 110 are transmitted through the original data lines DL1, DL2, . . . , the multiplexers and the data lines RD1, GD1, BD1, RD2, GD2, BD2 to the corresponded pixel electrodes to charge the corresponded pixel electrodes. Specifically, in the present embodiment, the multiplexers in the same selector set are turned on in the following sequence: turning on the first multiplexer MUX1→turning on the second multiplexer MUX2→turning on the third multiplexer MUX3→keeping the third multiplexer MUX3 to be turned on (charging the pixel electrodes in the next row at this time)→turning on the second multiplexer MUX2→turning on the first multiplexer MUX1→keeping the first multiplexer MUX1 to be turned on (charging the pixel electrodes in the row next to the next row at this time)→turning on the second multiplexer MUX2→turning on the third multiplexer MUX3→keeping the third multiplexer MUX3 to be turned on (charging the pixel electrodes in the row next to the row next to the next row at this time). In addition, in other embodiment of the present invention, the predetermined first multiplexer could be the third multiplexer and the predetermined last multiplexer could be the first multiplexer, and, at this time, the multiplexers in the same selector set are turned on in the following sequence: turning on the third multiplexer→turning on the second multiplexer→turning on the first multiplexer→keeping the first multiplexer to be turned on→turning on the second multiplexer→turning on the third multiplexer→keeping the third multiplexer to be turned on→turning on the second multiplexer→turning on the first multiplexer→keeping the first multiplexer to be turned on. In addition, in other embodiment of the present invention, the predetermined first multiplexer could be the second multiplexer MUX2 and the predetermined last multiplexer could be the first multiplexer MUX1, and, at this time, the multiplexers in the same selector set are turned on in the following sequence: turning on the second multiplexer→turning on the third multiplexer→turning on the first multiplexer→keeping the first multiplexer to be turned on→turning on the third multiplexer→turning on the second multiplexer→keeping the second multiplexer to be turned on→turning on the third multiplexer→turning on the first multiplexer→keeping the first multiplexer to be turned on. Obviously, other turning sequences could also be understood by those with ordinary skill in the art.

In the present embodiment, when the predetermined first multiplexer and the predetermined last multiplexer in the same selector set are turned on, the corresponded data lines RD1, BD1, RD2, BD2, . . . would charge two neighbored pixel electrode rows through cooperating with driving signals of scan lines SL1, SL2, . . . so that the former pixel electrodes are only affected by the feed through effect generated due to varying the potential of the gate of the thin film transistor from high potential to low potential while turning off the thin film transistor after the pixel electrode is charged, and the feed through voltage generated therefrom is assumed to be ΔV2 and is named as the second feed through voltage. The affection is represented as the voltage drop on the pixel electrodes, that is, a voltage drop ΔV2 would be generated on the pixel electrodes. The latter pixel electrodes are affected by the feed through effect generated due to varying the potential of the gate of the thin film transistor from high potential to low potential while turning off the thin film transistor and the feed through effect generated due to varying the potential of the gate of the multiplexer from high potential to low potential while turning off the multiplexer after the pixel electrode is charged, and the feed through voltage generated by varying the potential of the gate of the multiplexer from high potential to low potential for turning off the multiplexer is assumed to be ΔV1 and the latter pixel electrodes are affected by the feed through voltage ΔV1+ΔV2 after being charged. The affection is represented as the voltage drop on the pixel electrodes, that is, a voltage drop ΔV1+ΔV2 would be generated on the pixel electrodes, and the feed through voltage is named as the first feed through voltage. Similarly, voltage drops having the first feed through voltage would be also generated on the pixel electrodes connected to the multiplexers arranged between the predetermined first multiplexers and the predetermined last multiplexers.

In order to overcome the issue that different pixel electrodes are affected by two different feed through voltages, the common electrode comprises a first common electrode Com1 and a second common electrode Com2 in the present embodiment. The voltage on the first common electrode Com1 is the first common voltage, the voltage on the second common electrode Com2 is the second common voltage, and the first common voltage is different from the second common voltage. The first common electrode Com1 is arranged above the pixel electrodes on which the first feed through voltage is generated for compensating voltage drops generated on the pixel electrodes due to the first feed through voltage. Affection generated due to the voltage drop of the first feed through voltage on the pixel electrodes can be compensated through adjusting the first common voltage on the first common electrode Com1, so that the voltage of a pixel capacitor formed by the pixel electrode and the common electrode can be the same as or similar to a desired voltage and the displaying effects of the pixel capacitor are better. The second common electrode Com2 is arranged above the pixel electrodes on which the second feed through voltage is generated for compensating voltage drops generated on the pixel electrodes due to the second feed through voltage. Affection generated due to the voltage drop of the second feed through voltage on the pixel electrodes can be compensated through adjusting the second common voltage on the second common electrode Com2, so that the voltage of the pixel capacitor formed by the pixel electrode and the common electrode can be the same as or similar to the desired voltage and the displaying effects of the pixel capacitor are better. Therefore, the voltages of the pixel capacitors of which the second feed through voltage is generated on the pixel electrodes are compensated by the second common voltage on the second common electrode Com2 and the voltages of the pixel capacitors of which the first feed through voltage is generated on the pixel electrodes are compensated by the first common voltage on the first common electrode Com1 through adjusting voltages on the first common electrode Com1 and the second common electrode Com2 so that the voltages on the two kinds of pixel electrodes are the same as or similar to the voltage desired by the designers and a desired displaying effects of the thin film transistor liquid crystal display panel could be achieved.

Specifically, the first common voltage equals to the first feed through voltage and the second common voltage equals to the second feed through voltage in the present embodiment, so that the first common voltage would compensate the voltage drop generated on the pixel electrodes due to the first feed through voltage and the second common voltage would compensate the voltage drop generated on the pixel electrodes due to the second feed through voltage. Obviously, in other embodiments of the present invention, the first common voltage equals to V0 plus the first feed through voltage and the second common voltage equals to V0 plus the second feed through voltage when a common voltage V0 is existed on the common electrode of the existed technologies. In other words, the first common voltage equals to V0+ΔV1+ΔV2 and the second common voltage equals to V0+ΔV2, and the affection applied on the pixel electrodes and generated due to the first feed through voltage and the second feed through voltage can be compensated, too.

In the present embodiment, the multiplexers in each selector set are turned on in the looped sequence started from the predetermined first multiplexer to the predetermined last multiplexer and then from the predetermined last multiplexer to the predetermined first multiplexer, so that the frequencies of the control signals S1 and S3 received by the predetermined first multiplexer and the predetermined last multiplexer of each selector set are less than the frequency of the control signal S2 received by the multiplexers arranged between the predetermined first multiplexer and the predetermined last multiplexer. Specifically, in the same selector set, the frequency of the first control signal S1 received by the first multiplexer MUX1 and the frequency of the third control signal S3 received by the third multiplexer MUX3 are both less than the frequency of the second control signal S2 received by the second multiplexer MUX2 so that, compared to the solution of receiving control signals all with higher frequencies, the power consumption is reduced. In the present embodiment, the frequencies of the control signals received by the predetermined first multiplexer and the predetermined last multiplexer of each selector set M1, M2, . . . are half of the frequencies of the control signals received by the multiplexers between the predetermined first multiplexer and the predetermined last multiplexer. For example, in the same selector set, the frequency of the first control signal S1 received by the first multiplexer MUX1 equals to the frequency of the third control signal S3 received by the third multiplexer MUX3, and both the frequency of the first control signal S1 and the frequency of the third control signal S3 are half of the frequency of the second control signal S2 received by the second multiplexer S2.

Please refer to FIG. 2. In order to reduce the difficulties in supplying the first common voltage to the first common electrode Com1 and supplying the second common voltage to the second common electrode and in order to adjust the common voltages easily, the first common electrode Com1 is electrically connected as a whole and the second common electrode is electrically connected as a whole in the present embodiment. The first common electrode Com1 is electrically independent from the second common electrode Com2 so that the voltages on the first common electrode Com1 and the second common electrode Com2 are not interfered by each other. Furthermore, the first common voltage could be distributed on the whole first common electrode Com1 by just inputting the first common voltage to any point of the first common electrode Com1. Similarly, the second common voltage could be distributed on the whole second common electrode Com2 by just inputting the second common voltage to any point of the second common electrode Com2. Therefore, it is easy to adjust the first and second common voltages In the present embodiment, the pixel electrodes on which the voltage drops having the first feed through voltages are referred to as the first pixel electrodes, and the pixel electrodes on which the voltage drops having the second feed through voltages are referred to as the second pixel electrodes. The first pixel electrodes comprise all the green sub-pixel electrodes G, a part of the red sub-pixel electrodes R and a part of the blue sub-pixel electrodes B. The specific distribution of the first pixel electrodes could be found in FIG. 2, wherein the first pixel electrodes are arranged in Z shape along the vertical direction. The second pixel electrodes comprise the rest part of the red sub-pixel electrodes R and the rest part of the blue sub-pixel electrodes B, wherein the second pixel electrodes are arranged in S shape along the vertical direction. Correspondingly, the first common electrode comprises a plurality of first branch electrodes Com11. The first branch electrodes Com11 are arranged in Z shape corresponding to the first pixel electrodes. The first common electrode further comprises the first connecting electrode Com12 arranged along the horizontal direction. In each first branch electrode Com11, one terminal of the first branch electrode Com11 is connected to the first connecting electrode Com12. In the present embodiment, the second common electrode comprises a plurality of second branch electrodes Com21. The second branch electrodes Com21 are arranged in S shape corresponding to the second pixel electrodes. The second common electrode further comprises the second connecting electrode Com22 arranged along the horizontal direction. In each second branch electrode Com21, one terminal of the second branch electrode Com21 is connected to the second connecting electrode Com22.

In the present embodiment, each sub-line set comprises three data lines, wherein the pixel electrodes connected to the data lines RD1, RD2, RD3, . . . in the left side of the sub-line sets are all red sub-pixel electrodes R, the pixel electrodes connected to the data lines GD1, GD2, . . . in the middle of the sub-line sets are all green sub-pixel electrodes G, and the pixel electrodes connected to the data lines BD1, BD2, . . . in the right side of the sub-line sets are all blue sub-pixel electrodes B.

It is noted that the embodiments in the descriptions are described in a progressive way, the descriptions addressed in each embodiment are the differences between the embodiment and other embodiments, and the contents similar in the embodiments could be referred to each other. The descriptions made for hardware embodiments are simpler because they are basically similar to the method embodiments and could be referred to the descriptions made in the method embodiments.

According to the descriptions made in the above embodiments, the advantages of the present invention are as follows:

The common electrode comprises a first common electrode and a second common electrode, the first common voltage is the voltage on the first common electrode, the second common voltage is the voltage on the second common electrode, the first common electrode is arranged above the pixel electrode on which the first feed through voltage is generated, and the second common electrode is arranged above the pixel electrode on which the second feed through voltage is generated, therefore the first common voltage could compensate the voltage drop due to the first feed through voltage on the pixel electrode, the second common voltage could compensate the voltage drop due to the second feed through voltage on the pixel electrode, and the displaying effects of the thin film transistor liquid crystal display panel are better.

The contents disclosed above are only the preferred embodiments of the present invention, and should not be used for limiting the scope of the present invention. The equivalent variation based on the claimed scope of the present invention should be included in the scope of the present invention.

What is claimed is:

1. A thin film transistor liquid crystal display panel, comprising:
    a plurality of data lines extended along a vertical direction to transmit data signals;
    a plurality of scan lines extended along a horizontal direction, the scan lines and the data lines being crossly arranged to define a plurality of pixel regions, a plurality of pixel electrodes being disposed in the pixel regions, and a first feed through voltage and a second feed through voltage being voltage drops generated on the pixel electrodes, respectively; and
    a plurality of common electrodes comprising a first common electrode and a second common electrode, a first common voltage being a voltage on the first common electrode, a second common voltage being a voltage on the second common electrode, the first common electrode being arranged above the pixel electrode on which the first feed through voltage is generated for compensating the voltage reduction caused by the first feed through voltage, and the second common electrode being arranged above the pixel electrode on which the second feed through voltage is generated for compensating the voltage reduction caused by the second feed through voltage;

wherein the thin film transistor liquid crystal display panel further comprises:

a plurality of original data lines for inputting the data signals;

a plurality of selector sets, each of the selector sets comprising a plurality of multiplexers, sources of the multiplexers in a same selector set being electrically connected to a same original data line, and gates of the multiplexers in the same selector set receiving different control signals; wherein, the data lines are divided into a plurality of sub-line sets, the sub-line sets are arranged corresponding to the selector sets one by one, each sub-line set comprises at least two of the data lines, the data lines in a same sub-line set are electrically connected to drains of the multiplexers in the same selector set, respectively; a side of each data line away from the drain of the multiplexer is electrically connected to at least two of the pixel electrodes; the multiplexers in each selector set are turned on in a looped sequence started from a predetermined first multiplexer to a predetermined last multiplexer and then from the predetermined last multiplexer to the predetermined first multiplexer to input the data signals to corresponded pixel electrodes.

2. The thin film transistor liquid crystal display panel according to claim 1, wherein the pixel electrodes comprise a first pixel electrode and a second pixel electrode, the first feed through voltage is generated on the first pixel electrode, the second feed through voltage is generated on the second pixel electrode, a plurality of the first pixel electrodes are arranged in a plurality of first columns, a plurality of the second pixel electrodes are arranged in a plurality of second columns, the first common electrode comprises a plurality of first branch electrodes arranged along the vertical direction, the first branch electrodes are arranged corresponding to the first pixel electrodes arranged in the first columns, the second common electrode comprises a plurality of second branch electrodes arranged along the vertical direction, and the second branch electrodes are arranged corresponding to the second pixel electrodes arranged in the second columns.

3. The thin film transistor liquid crystal display panel according to claim 1, wherein the pixel electrodes comprise a first pixel electrode and a second pixel electrode, the first feed through voltage is generated on the first pixel electrode, the second feed through voltage is generated on the second pixel electrode, a plurality of the first pixel electrodes are arranged in a Z shape along the vertical direction, a plurality of the second pixel electrodes are arranged in a S shape along the vertical direction, the first common electrode comprises a first branch electrode, the first branch electrode is arranged corresponding to the first pixel electrodes and in the Z shape, the second common electrode comprises a second branch electrode, and the second branch electrode is arranged corresponding to the second pixel electrodes and in the S shape.

4. The thin film transistor liquid crystal display panel according to claim 1, wherein the first common electrode is electrically connected as a whole, and the second common electrode is electrically connected as a whole.

5. The thin film transistor liquid crystal display panel according to claim 1, wherein a number of the multiplexers in each selector set is M, a number of the data lines in each sub-line set is N, M is equals to N, and M is an integer greater than 2.

6. The thin film transistor liquid crystal display panel according to claim 1, wherein N and M are both 3.

7. The thin film transistor liquid crystal display panel according to claim 1, wherein frequencies of the control signals received by the predetermined first multiplexer and the predetermined last multiplexer of each selector set are less than frequencies of the control signals received by the multiplexers between the predetermined first multiplexer and the predetermined last multiplexer.

8. The thin film transistor liquid crystal display panel according to claim 7, wherein the frequencies of the control signals received by the predetermined first multiplexer and the predetermined last multiplexer of each selector set are half of the frequencies of the control signals received by the multiplexers between the predetermined first multiplexer and the predetermined last multiplexer.

9. The thin film transistor liquid crystal display panel according to claim 1, wherein the predetermined first multiplexer is the first one of the multiplexers of each selector set, and the predetermined last multiplexer is the last one of the multiplexers of each selector set.

* * * * *